(12) United States Patent
Katsui et al.

(10) Patent No.: US 12,027,118 B2
(45) Date of Patent: Jul. 2, 2024

(54) METHOD OF DRIVING A LIGHT EMITTING DISPLAY AND DISPLAY

(71) Applicants: JSR CORPORATION, Tokyo (JP); Mattrix Technologies, Inc, Gainesville, FL (US)

(72) Inventors: Hiromitsu Katsui, Yokkaichi (JP); Bo Liu, Gainesville, FL (US); Maxime Lemaitre, Gainesville, FL (US)

(73) Assignees: JSR CORPORATION, Tokyo (JP); MATTRIX TECHNOLOGIES, INC., Gainesville, FL (US)

( * ) Notice: Subject to any disclaimer, the term of this patent is extended or adjusted under 35 U.S.C. 154(b) by 33 days.

(21) Appl. No.: 17/606,651

(22) PCT Filed: Apr. 23, 2020

(86) PCT No.: PCT/JP2020/017498
§ 371 (c)(1),
(2) Date: Oct. 26, 2021

(87) PCT Pub. No.: WO2020/218420
PCT Pub. Date: Oct. 29, 2020

(65) Prior Publication Data
US 2022/0215800 A1    Jul. 7, 2022

Related U.S. Application Data

(60) Provisional application No. 63/004,041, filed on Apr. 2, 2020.

(30) Foreign Application Priority Data

Apr. 26, 2019  (JP) .................................. 2019086610

(51) Int. Cl.
*G09G 3/32* (2016.01)
*G09G 3/3233* (2016.01)

(52) U.S. Cl.
CPC ... *G09G 3/3233* (2013.01); *G09G 2310/0254* (2013.01); *G09G 2320/0233* (2013.01); *G09G 2320/0257* (2013.01)

(58) Field of Classification Search
CPC ......... G09G 3/3233; G09G 2310/0254; G09G 2320/0223; G09G 2320/0257; G09G 3/3291; H10K 59/125
(Continued)

(56) References Cited

U.S. PATENT DOCUMENTS

2001/0055828 A1    12/2001  Kaneko et al.
2008/0100609 A1*   5/2008   Lee .................... G09G 3/3291
                                                           345/212
(Continued)

FOREIGN PATENT DOCUMENTS

JP        2014505324 A      2/2014
KR     10-2008-0038999       5/2008
(Continued)

OTHER PUBLICATIONS

Decision of Refusal for JP Pat. Application No. 2019-086610, date of drafting Jan. 30, 2023.
(Continued)

*Primary Examiner* — Abdul-Samad A Adediran
(74) *Attorney, Agent, or Firm* — Thomas | Horstemeyer, LLP

(57) ABSTRACT

Various examples are provided related to driving a light emitting display in which variations in image quality and brightness can be suppressed despite long-term use, without adding a complicated circuit configuration. In one example, a method includes applying a voltage based on image data to be displayed to a gate electrode of a vertical organic light emitting transistor and applying a voltage, having a polarity opposite to that of the voltage applied to the gate electrode
(Continued)

of the vertical organic light emitting transistor, to the gate electrode of the vertical organic light emitting transistor based on a value of a voltage being applied to a source electrode of the vertical organic light emitting transistor.

19 Claims, 5 Drawing Sheets

(58) Field of Classification Search
USPC .................................................. 345/82, 212
See application file for complete search history.

(56) References Cited

U.S. PATENT DOCUMENTS

| 2009/0153449 | A1* | 6/2009 | Kaneko | G09G 3/3233 |
| | | | | 345/82 |
| 2010/0013746 | A1 | 1/2010 | Seto | |
| 2012/0162169 | A1 | 6/2012 | Ishizuka | |
| 2013/0240842 | A1 | 9/2013 | Rinzler et al. | |
| 2016/0233459 | A1* | 8/2016 | Tanaka | H10K 59/125 |
| 2018/0358568 | A1 | 12/2018 | Laun et al. | |

FOREIGN PATENT DOCUMENTS

| WO | 2009036071 A2 | 3/2009 |
| WO | 2010146707 A1 | 12/2010 |
| WO | 2011109693 A2 | 9/2011 |

OTHER PUBLICATIONS

Office Action for JP Pat. Application No. 2019-086610, date of drafting Aug. 31, 2022. .
International Search Report and Written Opinion of the International Searching Authority of PCT/JP/2020/017498 mailed Jul. 21, 2020.
Chinese Office Action in related Chinese application No. 202080029947.9, mailed Jul. 7, 2029. (English Translation Provided).
Chinese Office Action in related Chinese application No. 202080029947.9, mailed Jan. 18, 2024. (English Translation Provided by the JPO).
Appeal Decision issued in the corresponding Japanese Patent Application No. 2019-086610, Feb. 6, 2020. (English Translation Provided by the JPO).
Korean Office Action in related Korean application No. 10-1021-7034740, mailed Jan. 31, 2024. (English Translation Provided by the JPO).
TW Office Action issued in the corresponding TW patent application No. 109113908 mailed Feb. 16, 2024. (English Translation Provided by the Taiwanese attorney).
Decision of Refusal issued in Chinese Patent Application No. 202080029947.9, mailed Mar. 23, 2024 (English Translation Provided by the Applicant).

* cited by examiner

[Fig. 1]
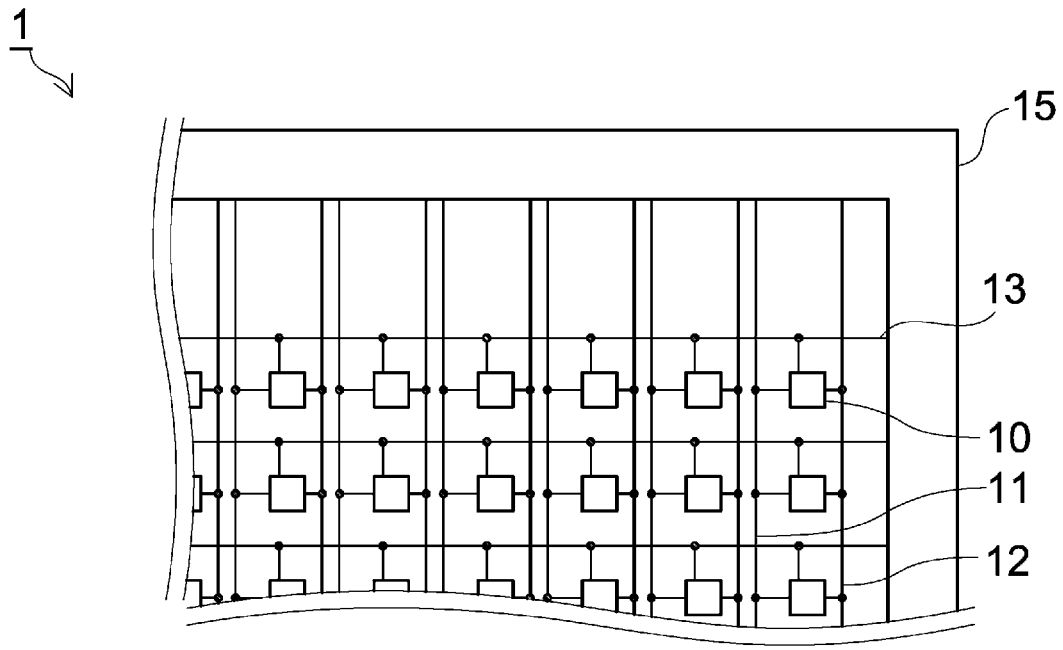
[Fig. 2]
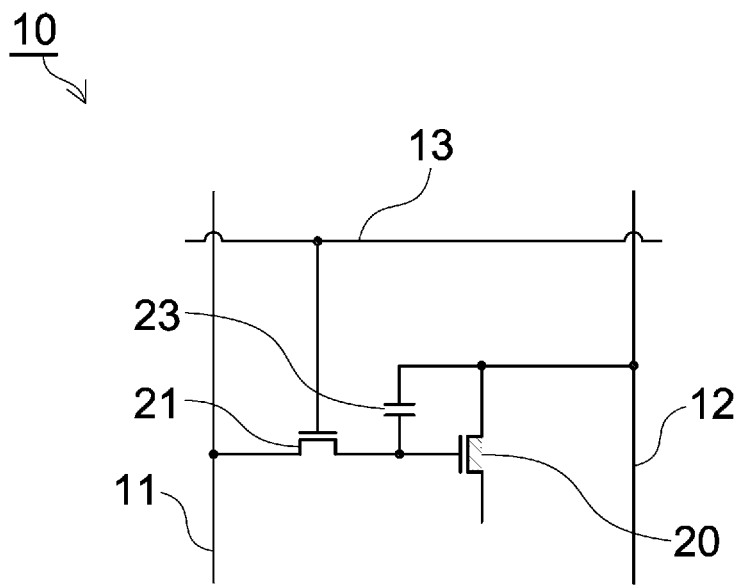

[Fig. 3]
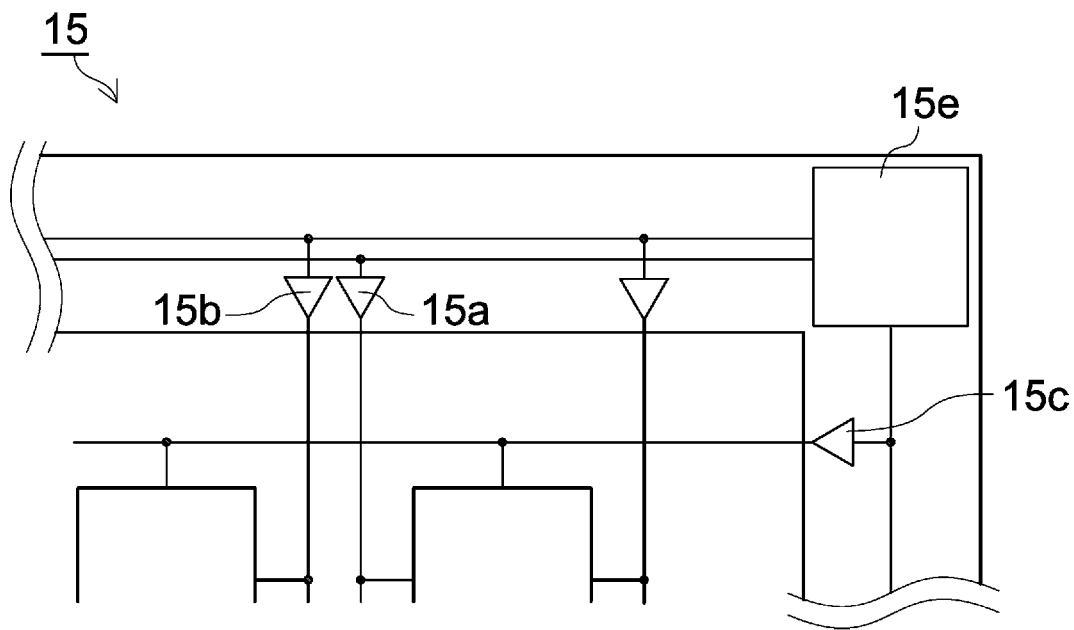
[Fig. 4]
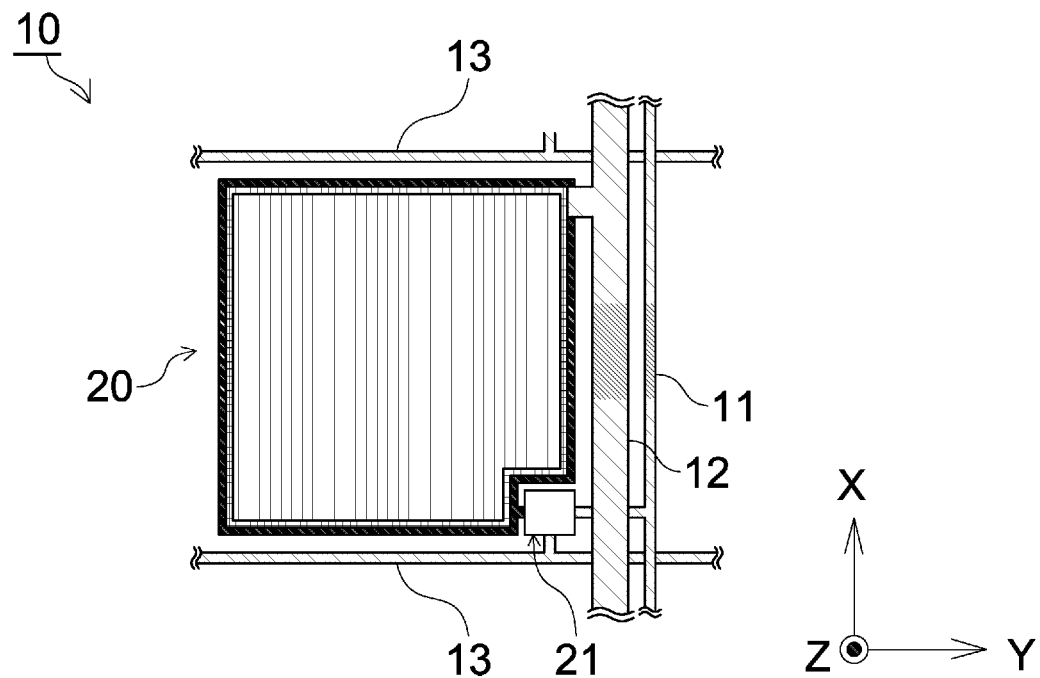

[Fig. 6]
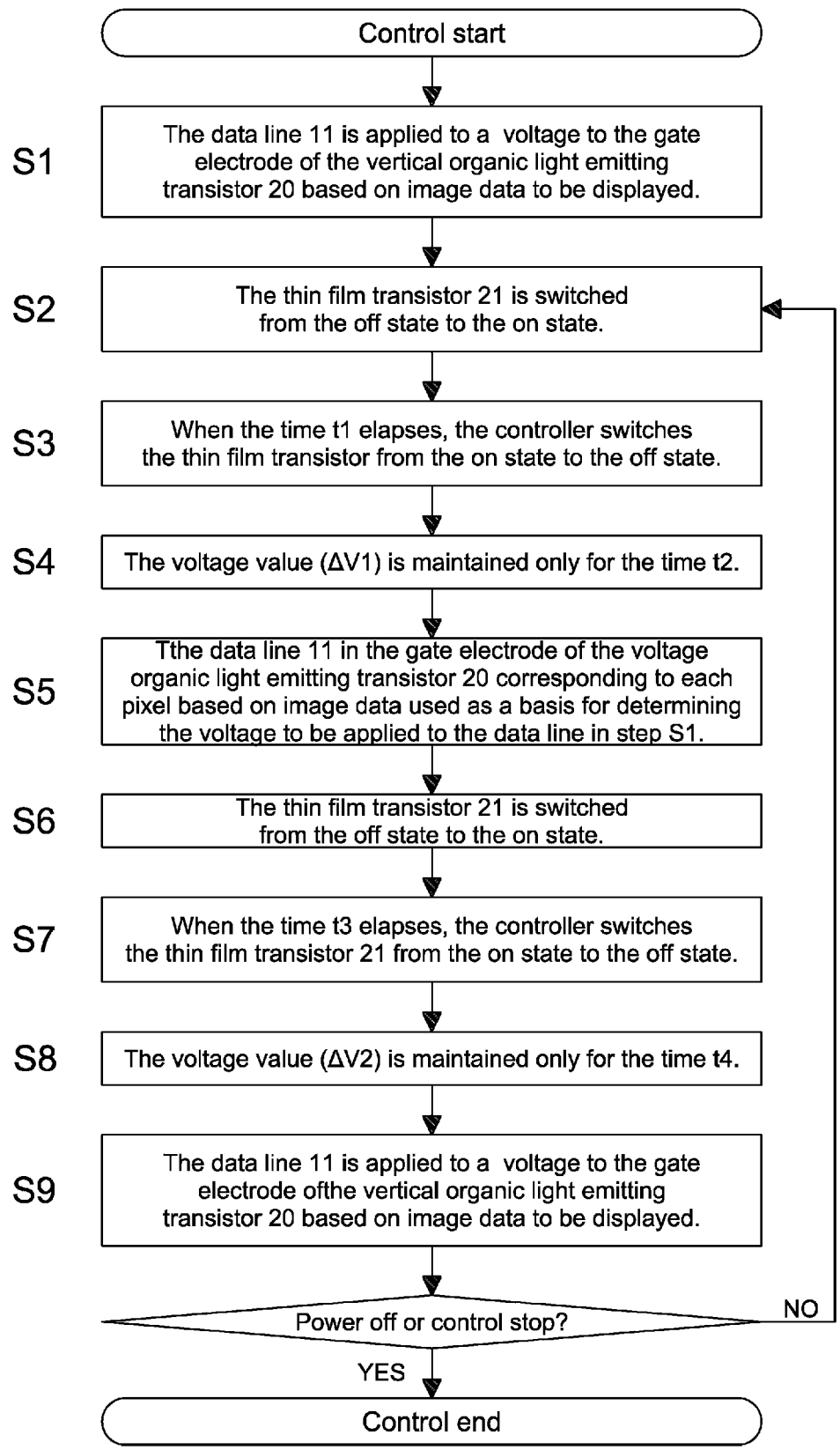

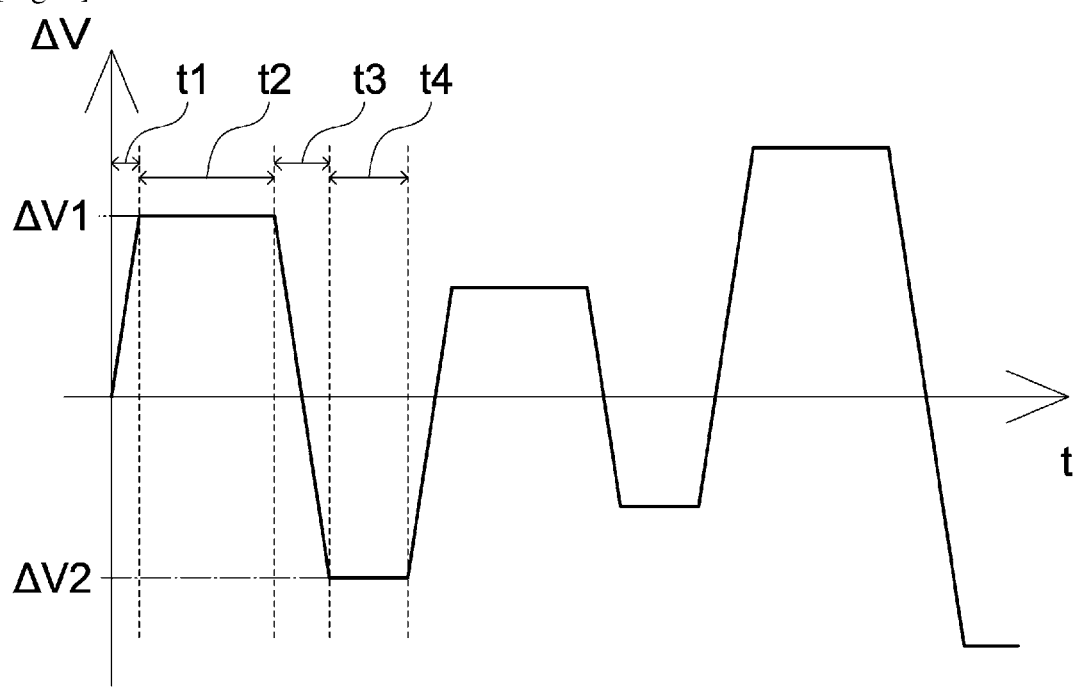

METHOD OF DRIVING A LIGHT EMITTING DISPLAY AND DISPLAY

CROSS-REFERENCE TO RELATED APPLICATIONS

This application is a national stage entry pursuant to 35 U.S.C. § 371 of Patent Cooperation Treaty (PCT) international application No. PCT/JP2020/017498, filed on Apr. 23, 2020, which claims priority to, and the benefit of the filing date of, U.S. provisional application No. 63/004,041, filed on Apr. 2, 2020, and JP patent application No. 2019-086610, filed on Apr. 26, 2019, which are all hereby incorporated by reference in their entireties.

TECHNICAL FIELD

The present invention relates to a method of driving and operating a light emitting display and a display.

BACKGROUND ART

In recent years, a display using an organic semiconductor element, such as an organic light emitting diode, as a light source element has been put into practical use, and is now commercially available. In the development of displays using the organic semiconductor element as the light source, in order to further improve performance, studies have been continuously made to achieve higher brightness, higher definition, lower power consumption, and longer life.

Conventionally, a light emitting element (also referred to as "pixel" and/or "subpixel") of an organic EL display is constituted of an organic light emitting diode (also referred to as "OLED") and a transistor that controls current flowing through the organic light emitting diode. The organic light emitting diode is a device that emits light in response to current input from a thin film transistor (also referred to as "TFT"), formed on a substrate rigid or flexible, to an organic EL layer sandwiched between an anode electrode and a cathode electrode.

However, for the above configuration, Patent Document 1 below describes a transistor that serves as an element for reducing the number of control elements and increasing a light emission area to achieve higher brightness and controls voltage applied to a gate electrode to adjust current flowing through the transistor, and describes a vertical organic light emitting transistor (also referred to as "VOLET") that emits light by itself according to the amount of current through the vertical organic light emitting transistor. Patent Document 2 below describes a display using a vertical organic light emitting transistor, and is expected to greatly increase the brightness of the display. Patent Document 3 below describes a vertical field effect transistor with a charge storage layer inserted between its gate electrode and electrically percolating source electrode that can have a tunable threshold voltage modulated by charges injected and stored in the charge storage layer.

PTL 1: Patent Document 1: WO 2009/036071
PTL 2: Patent Document 2: JP-A-2014-505324
PTL 3: Patent Document 3: WO2011109693A2

SUMMARY OF INVENTION

Similar to a field effect transistor, the vertical organic light emitting transistor includes a source electrode, a gate electrode, and a drain electrode. The source electrode corresponds to an anode electrode, and the drain electrode corresponds to a cathode electrode. An EL element and an organic semiconductor layer are formed between the source electrode and the drain electrode, and each electrode is configured to emit EL by passing current through the EL element and the organic semiconductor layer. At least one of the source electrode and the drain electrode is configured to be transparent so that light obtained by light emission is emitted to the outside.

It is known that when an organic light emitting diode used in a conventional configuration continues to be lit for a long period of time, the deterioration proceeds according to injected current and the brightness gradually decreases. This is considered to be caused by a variation in interlayer injection efficiency due to a chemical change, charge accumulation to each organic layer interface, or the like in the organic light emitting diode. The same applies to a vertical organic light emitting transistor which emits EL by passing current through the EL element and the organic semiconductor layer sandwiched between the source electrode corresponding to the anode electrode and the drain electrode corresponding to the cathode electrode as described above.

However, the present inventor has found that depending on detailed device structures and materials used, a display using the vertical organic light emitting transistor may suffer from the following problems through intensive studies. When the vertical organic light emitting transistor applies voltage to the gate electrode in order to emit EL by passing current through the EL element and the organic semiconductor layer, charge accumulates at an interface between the gate electrode and a gate insulating film layer, at an interface between the source electrode, and the organic semiconductor layer and a surface layer, etc., and at each of the gate insulating film layer and the surface layer. When charge accumulates at these interfaces, a phenomenon occurs in which even if the vertical organic light emitting transistor applies a predetermined voltage to the gate electrode, charge equivalent to that in a state where the transistor has just been manufactured or at the time of factory shipment is not injected to the EL element and the organic semiconductor layer, so that the brightness decreases more rapidly than the organic light emitting diode. Thus, the display using the vertical organic light emitting transistor tends to cause characteristic fluctuations in a short period of time and tends to have a short life, so that reliability as a product becomes a problem.

Even if the current flowing through the vertical organic light emitting transistor changes, it is possible to configure a circuit that performs feedback control so that a desired current flows. However, this adds a complicated circuit configuration, so that a region for element placement is required. That is, a light emitting region becomes small, and achievement of higher brightness is hindered.

In view of the above problems, an object of the present invention is to provide a method of driving a light emitting display using a vertical organic light emitting transistor that suppresses variation in brightness over a long period of time without adding a complicated circuit configuration and a display.

A method of driving a light emitting display according to the present invention includes a step (A) of applying a voltage based on image data to be displayed to a gate electrode of a vertical organic light emitting transistor, and a step (B) of, after the step (A), applying a voltage, having a polarity opposite to that of the voltage applied to the gate electrode of the vertical organic light emitting transistor in the step (A), to the gate electrode of the vertical organic light emitting transistor based on a value of a voltage being applied to a source electrode of the vertical organic light emitting transistor.

First, the operation and effect when performing the above-described method in the configuration of a combination of an organic light emitting diode and a thin film transistor, which is one of the conventional configurations, will be confirmed. Many thin film transistors are configured such that a source electrode and a drain electrode are symmetrical with respect to a gate electrode. Even if a voltage with reversed polarity is applied to the gate electrode of the thin film transistor, this just causes the release of charge accumulated only at the source electrode, and a gate insulating film layer interface and an organic semiconductor interface near the source electrode, and there is no effect of recovering thing film transistor characteristics.

However, when the above method of applying reverse voltage is performed in the display including the vertical organic light emitting transistor, charge accumulated at, for example, an interface between the source electrode of the vertical organic light emitting transistor, and the gate insulating film layer and the organic semiconductor layer is released, and the characteristics of the vertical organic light emitting transistor can be recovered to approach the state where the transistor has just been manufactured or at the time of factory shipment.

The vertical organic light emitting transistor is configured such that the source electrode is located significantly close to the gate electrode relative to the drain electrode, and the source electrode covers most of the gate insulating film layer and the gate electrode. Thus, this is due to the fact of effectively using such characteristics of the vertical organic light emitting transistor that the voltage applied to the gate electrode is reversed from a higher state to a lower state than the voltage applied to the source electrode, or from the high state to the lower state, so that charge accumulation at the interface between the source electrode that affects the transistor characteristics, and the gate insulating film layer and the organic semiconductor layer can be efficiently released.

As described above, since the brightness of the vertical organic light emitting transistor is adjusted by adjusting the voltage applied to the gate electrode, a thin film transistor for performing drive control is also unnecessary. According to the above method, it is not necessary to add a new circuit, and it can be realized only by configuring a simple control circuit or control program for a driver to apply a reverse voltage to a data line at a predetermined timing. Therefore, a detection configuration for monitoring a current value of the vertical organic light emitting transistor and complicated control are not required.

In addition, as described in Patent Document 1, since a large parasitic capacitor is formed between the gate electrode and the source electrode, it is not necessary to separately provide a capacitor for maintaining voltage. Even if there is a case where a capacitance value is insufficient and it is necessary to provide a capacitor, it is only necessary to connect a capacitor with a capacitance value sufficient to compensate for the shortage, so that it is configured with small elements as compared to a conventional configuration.

Therefore, according to the above method, the required number of elements is small, the light emitting region of the vertical organic light emitting transistor can be expanded to the maximum, and the brightness of the display can be further increased.

In the driving a light emitting method, the step (A) and the step (B) may be performed for each frame rate.

According to the above method, every time an image to be displayed is updated, charge accumulated at, for example, the interface between the source electrode of the vertical organic light emitting transistor and, the gate insulating film layer and the organic semiconductor is released. Thus, deterioration due to a long-time charge accumulation state can be suppressed, and the lifetime of the display can be further extended.

Further, every time an image to be displayed is updated, the current supplied to the vertical organic light emitting transistor can be stopped by modulating the gate voltage of the vertical organic light emitting transistor and/or by modulating the Vdd voltage of the current supply line, so that a black screen in which the vertical organic light emitting transistor is not lit is instantaneously inserted. Thereby, it is possible to suppress afterimages when a displayed image is updated to the next image to be displayed.

Control may be performed such that the larger a difference (Vg1−Vs1) between a voltage (Vs1) applied to the source electrode of the vertical organic light emitting transistor and a voltage (Vg1) applied to the gate electrode of the vertical organic light emitting transistor in the step (A) of the driving a light emitting method, the larger a difference (ΔV2=Vg2−Vs2) between a voltage (Vs2) applied to the source electrode of the vertical organic light emitting transistor and a voltage (Vg2) applied to the gate electrode of the vertical organic light emitting transistor in the step (B).

On the other hand, control may be performed such that the difference between the voltage applied to the source electrode of the vertical organic light emitting transistor and the voltage applied to the gate electrode of the vertical organic light emitting transistor in the step (B) of the driving a light emitting method is equal to the difference between the voltage applied to the source electrode of the vertical organic light emitting transistor and the voltage applied to the gate electrode of the vertical organic light emitting transistor in the step (A).

The voltage applied to the gate electrode of the vertical organic light emitting transistor is different depending on image data to be displayed. Accordingly, in the display of each image data, the amount of charge accumulated at, for example, an interface between the source electrode of the vertical organic light emitting transistor, and the gate insulating film layer and the organic semiconductor layer is also different. Thus, the voltage necessary for sufficiently releasing the charge accumulated at, for example, the interface between the source electrode of the vertical organic light emitting transistor, and the gate insulating film layer and the organic semiconductor layer is also different.

Thus, in order to release the charge accumulated at, for example, the interface between the source electrode of the vertical organic light emitting transistor, and the gate insulating film layer and the organic semiconductor layer according to a voltage applied to the gate electrode of the vertical organic light emitting transistor so as to display an image for each frame rate, as described above, the voltage applied to the gate electrode of the vertical organic light emitting transistor is adjusted, so that the charge accumulated at, for example, the interface between the source electrode of the vertical organic light emitting transistor, and the gate insulating film layer and the organic semiconductor layer can be sufficiently released, and the characteristics can be recovered. Therefore, the lifetime of the display can be further extended.

The time for applying a voltage to the gate electrode of the vertical organic light emitting transistor in the step (B) of the driving a light emitting method may be shorter than the time for applying a voltage to the gate electrode of the vertical organic light emitting transistor in the step (A).

As described above, every time an image to be displayed is updated, the current supplied to the vertical organic light emitting transistor can be stopped, so that a black screen in which the vertical organic light emitting transistor is not lit is instantaneously inserted. Thus, if the display of the black screen takes the same time as or a time longer than the display time of an image to be displayed, a display on a display device repeatedly blinks or becomes less bright.

As in the above method, when the time for applying a voltage to the gate electrode of the vertical organic light emitting transistor in step (B) is shorter than the time for applying a voltage to the gate electrode of the vertical organic light emitting transistor in step (A), the time during which the vertical organic light emitting transistor emits light is longer than the time when the transistor is extinguished, and it is possible to suppress a display that blinks repeatedly due to a black screen or a black display.

The display of the present invention is a display including a plurality of vertical organic light emitting transistors and a controller for controlling driving a light emitting of the vertical organic light emitting transistor, and the controller executes the above driving a light emitting method to display an image.

With the above configuration, since the controller controls display suitably, the display can display smooth images and moving images. In addition, since expected voltage can be more accurately applied to a data line, a current supply line, and a gate line, a display operation and an operation of releasing charge accumulated at each interface can be executed without imposing a heavy load on elements constituting a pixel.

According to the present invention, it is possible to realize a method of driving a light emitting display in which variations in image quality and brightness are suppressed despite long-term use, without adding a complicated circuit configuration.

BRIEF DESCRIPTION OF DRAWINGS

FIG. 1 is a schematic configuration diagram of a portion of an embodiment of a display;
FIG. 2 is a circuit diagram of a light emitting unit in FIG. 1;
FIG. 3 is a configuration diagram of a controller in FIG. 1;
FIG. 4 is a top view of a schematic element configuration of the light emitting unit configured on a substrate;
FIG. 6 is a flowchart showing a driving control procedure of the light emitting unit;
and
FIG. 7 is a graph showing variations in voltage applied to a gate electrode of a vertical organic light emitting transistor.

DETAILED DESCRIPTION OF THE PREFERRED EMBODIMENTS

Figure 5:
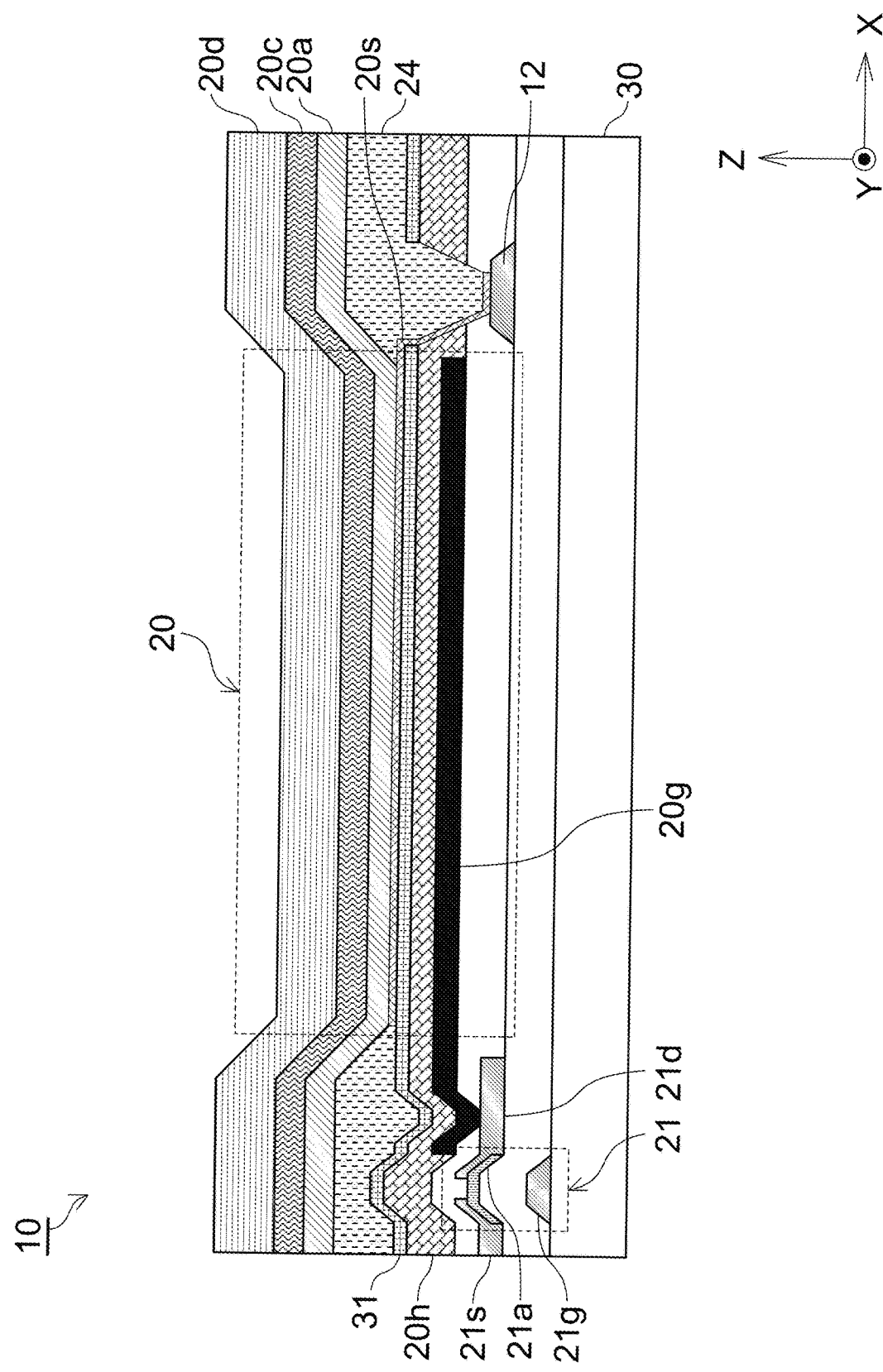
FIG. 5 is a side view of the light emitting unit in FIG. 4.

Hereinafter, the configuration and driving a light emitting method of a display of the present invention will be described with reference to the drawings. The following drawings are schematically illustrated, and the dimensional ratio and the number in the drawings do not necessarily coincide with the actual dimension ratio and the actual number.

Configuration

First, the configuration of the display will be described. FIG. 1 is a schematic configuration diagram of a portion of an embodiment of a display 1. As shown in FIG. 1, the display 1 of the present embodiment includes a light emitting unit 10 including vertical organic light emitting transistors arranged in an array, a data line 11 that supplies voltage to a gate electrode of the vertical organic light emitting transistor, a current supply line 12 that supplies current to a source electrode of the vertical organic light emitting transistor, a gate line 13 that controls a thin film transistor, and a controller 15.

FIG. 2 is a schematic circuit diagram of the light emitting unit 10 in an embodiment of the display 1. As shown in FIG. 2, the light emitting unit 10 includes a vertical organic light emitting transistor 20, a thin film transistor 21 that controls voltage supply to the gate electrode of the vertical organic light emitting transistor 20, and a capacitor 23 connected between a source electrode and the gate electrode of the vertical organic light emitting transistor 20 (independent capacitor element may or may not be necessary depending on the capacitance value of the gate electrode and source electrode of the vertical light emitting transistor 20).

The data line 11 is wiring for applying a voltage to the gate electrode of the vertical organic light emitting transistor 20 via the thin film transistor 21 in order to adjust a light emission luminance of the vertical organic light emitting transistor 20 according to an image to be displayed. The current supply line 12 is wiring for supplying current to the source electrode of the vertical organic light emitting transistor 20.

The gate line 13 is connected to the gate electrode of the thin film transistor 21, and controls on/off of the thin film transistor 21, that is, controls connectivity between the gate electrode of the vertical organic light emitting transistor 20 and the data line 11.

The controller 15 controls the voltage of the data line 11 and the voltage of the gate line 13 to adjust the light emission luminance of each of the light emitting units 10 (vertical organic light emitting transistor 20). Details regarding the control will be described later in the item of control method.

The specific configuration of each block constituting the controller 15 is configured by a dedicated circuit, a processor controlled by a software program, or a combination thereof. For example, the dedicated circuit may be a dedicated integrated circuit (Application Specific Integrated Circuit, abbreviated as ASIC) or a programmable device (PLD, CPLD, FPGA). ASIC is configured to be electrically connected to a logic circuit, which generates a control signal configured on the substrate on which the vertical organic light emitting transistor 20 is configured, a driver circuit for driving each of the vertical organic light emitting transistors 20, or each line (11, 12, 13, 14). The programmable device can built the dedicated circuit by programming.

The processor may be a central processing unit (abbreviated as CPU), another general-purpose processor, a digital signal processor (abbreviated as DSP), an ASIC, or the like. The general-purpose processor may be a microprocessor, and the processor may be any standard processor or the like. Various processing steps may be executed directly by a hardware processor, or may be executed by a combination of hardware and software (or a software function module) in the processor. Furthermore, a control device such as a microcontroller may be used.

The capacitor 23 is a voltage holding element which is disposed to maintain a displayed image for a predetermined time while thin film transistor 21 is in an off state, and holds a voltage between the gate electrode and the source electrode of the vertical organic light emitting transistor 20.

Next, the structure of each element formed on the substrate will be described. FIG. 4 is a top view of a schematic element configuration of the light emitting unit 10 configured on a substrate 30. FIG. 5 is a side view of the light emitting unit 10 in FIG. 4. As shown in FIGS. 4 and 5, the vertical organic light emitting transistor 20 and the thin film transistor 21 are formed in a region divided by the data line 11, the current supply line 12, and the gate line 13.

The substrate 30 may be made of a glass material or a plastic material such as PET (Poly Ethylene Terephthalate), PEN (Poly Ethylene Naphthalate), or polyimide.

In the following description, a description will be given by assuming that a direction in which the data line 11 and the current supply line 12 are wired is an X direction, a direction in which the gate line 13 is wired is a Y direction, a direction orthogonal thereto is a Z direction, and a side toward a direction (+Z direction) away from the substrate 30 is an upper layer side.

In the configuration of the vertical organic light emitting transistor 20, a source electrode layer 20s is formed, and a gate electrode layer 20g is further formed below the source electrode layer 20s through a gate insulating film layer 20h formed of a dielectric. The source electrode layer 20s is configured to apply a carbon-containing conductive material (in this embodiment, carbon nanotubes) onto a drain electrode layer 20d corresponding to the cathode electrode, an organic EL layer 20c, an organic semiconductor layer 20a, and a surface of a surface layer 31 from the upper layer. When a voltage is applied to the gate electrode layer 20g, a Schottky barrier between the organic semiconductor layer 20a and the source electrode layer 20s changes, and current flows from the source electrode layer 20s to the organic semiconductor layer 20a and the organic EL layer 20c once a predetermined threshold value is exceeded, so that the vertical organic light emitting transistor 20 emits light.

In the display 1 of this embodiment, the substrate 30 is made of a material that is transparent to visible light, and the gate electrode layer 20g and the source electrode layer 20s also have sufficient levels of transparency for the visible light to pass through without being totally blocked, so that light emitted from the organic EL layer 20c passes through the substrate 30 and is emitted to the outside, thereby displaying an image. As described above, the method of passing light through the substrate 30 and emitting the light is also referred to as "bottom emission method", and has advantages that wiring connection between electrodes is easy and manufacture is easy.

In the thin film transistor 21, a source electrode layer 21s and a drain electrode layer 21d are connected with an oxide semiconductor layer 21a interposed therebetween, and a gate electrode layer 21g is formed below the oxide semiconductor layer 21a with an insulating film layer or a dielectric layer interposed therebetween. In each case, when a voltage is applied to the gate electrode layer 21g, a channel is formed in the oxide semiconductor layer 21a, and the source electrode layer 21s and the drain electrode layer 21d are energized.

In the thin film transistor 21, the source electrode layer 21s is connected to the data line 11, and the drain electrode layer 21d is connected to the gate electrode layer 20g of the vertical organic light emitting transistor 20. In the thin film transistor 21, the source electrode layer 21s may be connected to the gate electrode layer 20g of the vertical organic light emitting transistor 20, and the drain electrode layer 21d may be connected to the data line 11.

As shown in FIG. 4, the vertical organic light emitting transistor 20 is formed so that the light emitting region is as large as possible in order to achieve high aperture ratio therefore facilitates high brightness, and the thin film transistor 21 is formed as small as possible at a corner of a segmented region so that the influence is small with respect to the light emitting region of the vertical organic light emitting transistor 20.

In FIGS. 4 and 5, the capacitor 23 is not illustrated, but as shown in FIG. 5, in the vertical organic light emitting transistor 20 of this embodiment, the source electrode layer 20s and the gate electrode layer 20g are arranged facing each other with the gate insulating film layer 20h interposed therebetween, so that the capacitor 23 is provided as a parasitic element. In such a capacitor 23 as a parasitic element, when a capacitance value is insufficient, another capacitor may be additionally formed.

Hereinafter, materials used for each layer will be exemplified.

Examples of the material of the drain electrode layer 20d of the vertical organic light emitting transistor 20 include single-layer or multilayer graphene, carbon nanotube, aluminum (Al), lithium fluoride (LiF), molybdenum oxide (MoXOY), indium tin oxide (ITO), and zinc oxide (ZnO).

Examples of the material of the gate electrode layer 20g of the vertical organic light emitting transistor 20 include zinc oxide (ZnO) doped with a metal such as aluminum (Al), tin (Sn), yttrium (Y), scandium (Sc), or gallium (Ga), metal-doped and undoped transparent conductive oxides such as indium oxide (In2O3), tin dioxide (SnO2), and cadmium oxide (CdO), and materials containing combinations thereof. Alternatively, aluminum (Al), gold (Au), silver (Ag), platinum (Pt), cadmium (Cd), nickel (Ni) and tantalum (Ta), and combinations thereof, as well as p- or n-doped silicon (Si) and gallium arsenide (GaAs) may be employed.

Examples of the material of the gate insulating film layer 20h between the surface layer 31 and the gate electrode layer 20g of the vertical organic light emitting transistor 20 include organic compounds such as silicon oxide (SiOX), aluminum oxide (Al2O3), silicon nitride (Si3N4), yttrium oxide (Y2O3), lead titanate (PbTiOX), aluminum titanate (AlTiOX), glass and parylene polymer, polystyrene, polyimide, polyvinylphenol, polymethyl methacrylate, and fluoropolymer.

Examples of the material of the organic semiconductor layer 20a of the vertical organic light emitting transistor 20 include linear condensed polycyclic aromatic compounds (or acene compounds) such as naphthalene, anthracene, rubrene, tetracene, pentacene, hexacene, and derivatives thereof, pigments such as copper phthalocyanine (CuPc) compounds, azo compounds, perylene compounds, and derivatives thereof, low molecular weight compounds such as hydrazone compounds, triphenylmethane compounds, diphenylmethane compounds, stilbene compounds, allyl vinyl compounds, pyrazoline compounds, triphenylamine derivatives (TPD), allylamine compounds, low molecular weight amine derivatives (a-NPD), 2,2',7,7'-tetrakis(diphenylamino)-9,9'-spirobifluorene (spiro-TAD), N,N'-di(1-naphthyl)-N,N'-diphenyl-4,4'-diamonobiphenyl (spiro-NPB), 4,4',4''-tris[N-3-methylphenyl-N-phenylamino]triphenylamine (mMTDATA), 2,2',7,7'-tetrakis(2,2-diphenylvinyl)-9,9-spirobifluorene (spiro-DPVBi), 4,4'-bis(2,2-diphenylvinyl)biphenyl (DPVBi), (8-quinolinolato)aluminum (Alq), tris(8-quinolinolato)aluminum (Alq3), tris(4-methyl-8quinolinolato)aluminum (Almq3), and derivatives thereof, polymer compounds such as for polythiophene, poly(p-phenylene vinylene) (PPV), biphenyl group-containing polymers, dialkoxy group-containing polymers, alkoxyphenyl PPV, phenyl PPV, phenyl/dialkoxy PPV copolymers, poly(2-methoxy-5-(2'-ethylhexyloxy)-1, 4-phenylenevinylene) (MEH-PPV), poly(ethylenedioxythiophene) (PEDOT), poly(styrenesulfonic acid) (PSS), poly (aniline) (PAM), poly(N-vinylcarbazole), poly (vinylpyrene), poly(vinylanthracene), pyreneformaldehyde resin, ethylcarbazole formaldehyde halogenated resin, and modified compounds thereof, n-type transporting organic low molecules such as 5,5_-diperfluorohexylcarbonyl-2,2_: 5_,2_:5_,2_-quaterthiophene (DFHCO-4T), DFH-4T, DFCO-4T, P(NDI2OD-T2), PDI8-CN2, PDIF-CN2, F16CuPc, fullerene, naphthalene, perylene, and oligothiophene derivatives, oligomers, or polymer, as well as aromatic compounds having thiophene rings such as thieno[3, 2-b]thiophene, dinaphthyl[2,3-b: 2',3'-f]thieno[3,2-b] thiophene (DNTT), and 2-decyl-7-phenyl[1]benzothieno[3, 2-b][1]benzothiophene (BTBT).

Here, in the vertical organic light emitting transistor 20, an organic semiconductor with an appropriate energy level is suitably selected, so that a hole injection layer, a hole transport layer, an organic EL layer, an electron transport layer, an electron injection layer, and the like typically used in OLED displays can be favorably used. A color of light emitted to the outside is adjusted such that light of color such as red, green, and blue is emitted by selecting the material constituting the organic EL layer 20c. Furthermore, the vertical organic light emitting transistor 20 can be configured to emit white light, and in the pixel with the same vertical organic light emitting transistor 20 a color filter may be incorporated and used to select light of a desired color and thus to emit the light. Furthermore, the vertical organic light emitting transistor 20 can be configured to emit short wavelength light such as blue light, and in the pixel with the same vertical organic light emitting transistor 20 a layer consists of energy conversion materials such as quantum dots may be used to convert emitted light to desired wavelengths and thus to emit the light of desired color such as green and red.

The surface layer 31 is a layer formed on the gate insulating film layer 20h for the purpose of securing the source electrode layer 20s (particularly CNT layer). The surface layer 31 can be formed by applying a composition containing a binder resin formed from a silane coupling material, an acrylic resin, and the like.

Examples of the material of the oxide semiconductor layer 21a configured by the thin film transistor 21 include In—Ga—Zn—O-based semiconductors, Zn—O-based semiconductors (ZnO), In—Zn—O-based semiconductors (IZO (registered trademark)), Zn—Ti—O-based semiconductors (ZTO), Cd—Ge—O-based semiconductors, Cd—Pb—O semiconductors, CdO (cadmium oxide), Mg—Zn—O-based semiconductors, In—Sn—Zn—O-based semiconductors (for example, In2O3-SnO2-ZnO), and In—Ga—Sn—O based semiconductors.

In this embodiment, the thin film transistor 21 is a thin film transistor made of an oxide semiconductor, but may be a thin film transistor made of amorphous silicon. Either p-type or n-type may be used. Furthermore, as a specific configuration, any configuration such as a staggered type, an inverted staggered type, a coplanar type, or an inverted coplanar type may be employed.

A bank layer 24 is formed between the organic semiconductor layer 20a and the surface layer 31 for insulation, and at a portion where the source electrode layer 20s is connected to the data line 11, the bank layer 24 is filled so as to fill a gap formed in the surface layer 31 and the gate insulating film layer 20h for insulation.

As the vertical organic light emitting transistor 20, the vertical organic light emitting transistors 20 described in Patent Documents 1 and 2 can also be employed.

Control Method

Finally, a display control method will be described. In this embodiment, as shown in FIG. 1, the light emitting units 10 are arranged in an array. A column in the vertical direction in FIG. 1 shares the data line 11 and the current supply line 12, and in a column in the horizontal direction in FIG. 1, the gate line 13 is provided.

When the power of the display 1 is turned on and the control is started, the display 1 applies a voltage, determined based on image data, to the data line 11 in order to apply the voltage to the gate electrode of the vertical organic light emitting transistor 20 corresponding to one pixel. Then, the controller 15 performs control to switch the thin film transistor 21, connected to the vertical organic light emitting transistor 20 to be supplied with the voltage applied to the data line 11, from the off state to the on state.

When the voltage applied to the data line 11 is supplied to the vertical organic light emitting transistor 20, the controller 15 performs control to switch the thin film transistor 21 from the on state to the off state. At this time, the voltage applied to the gate electrode of the vertical organic light emitting transistor 20 is maintained by the capacitor 23, so that the light emission luminance is maintained.

Thereafter, the display 1 applies a voltage, determined based on image data, to the data line 11 in order to apply the voltage to the vertical organic light emitting transistor 20 corresponding to another pixel, and the controller 15 controls the thin film transistor 21.

These controls are sequentially performed on each of the vertical organic light emitting transistors 20, and the above-described control is performed on all the vertical organic light emitting transistors 20, whereby an image is displayed on the display 1.

As described above, since the display 1 repeats the same procedure sequentially for the vertical organic light emitting transistor 20 corresponding to each pixel, details of the control procedure of one light emitting unit 10 will be described below.

FIG. 6 is a flowchart showing a driving control procedure of the light emitting unit 10. FIG. 7 is a graph showing variations in voltage applied to the gate electrode of the vertical organic light emitting transistor 20. In FIG. 7, the vertical axis represents a difference ($\Delta V = V_g - V_s$) between a value ($V_g$) of the voltage applied to the gate electrode of the vertical organic light emitting transistor 20 and a value ($V_s$) of the voltage applied to the source electrode of the vertical organic light emitting transistor 20, and the horizontal axis represents a time axis.

In this specification, a description will be given assuming that the vertical organic light emitting transistor 20 is constituted as one indicating that when $\Delta V$ is positive, as the absolute value thereof becomes larger, the vertical organic light emitting transistor 20 emits light with higher brightness, that is, the vertical organic light emitting transistor 20 is constituted as an n-type transistor. However, the vertical organic light emitting transistor 20 may be constituted as a p-type transistor in which when $\Delta V$ is negative, as the absolute value thereof becomes larger, the vertical organic light emitting transistor 20 emits light with higher brightness.

As shown in FIGS. 6 and 7, first, in order to apply a determined voltage to the gate electrode of the target vertical organic light emitting transistor 20 based on image data to be displayed, this voltage is applied to the data line 11 (S1). Then, the controller 15 performs control to switch the thin film transistor 21, connected to the gate electrode of the target vertical organic light emitting transistor 20, from the off state to the on state (S2).

Here, after the thin film transistor 21 is switched from the off state to the on state, the time for the gate electrode of the vertical organic light emitting transistor 20 to reach substantially the same voltage as the voltage applied to the data line 11 is defined as t1. The substantially the same voltage is preferably a voltage of 95% or more with respect to the voltage applied to the data line 11, more preferably a voltage of 99% or more.

When the time t1 elapses, the controller 15 switches the thin film transistor 21 from the on state to the off state (S3), and the capacitor 23 maintains the voltage value (ΔV1) for a predetermined period t2 (S4).

After the voltage value (ΔV1) is maintained only for a predetermined period t2, the controller 15 applies a value of voltage having a polarity opposite to that of ΔV1 to the data line 11 in the gate electrode of the vertical organic light emitting transistor 20 corresponding to each pixel based on image data used as a basis for determining the voltage to be applied to the data line 11 in step S1 (S5). Then, the controller 15 performs control to switch the thin film transistor 21, connected to the gate electrode of the target vertical organic light emitting transistor 20, from the off state to the on state (S6).

Here, after the thin film transistor 21 is switched from the off state to the on state, the time for the gate electrode of the vertical organic light emitting transistor 20 to reach substantially the same voltage as the voltage applied to the data line 11 is defined as t3.

When the time t3 elapses, the controller 15 switches the thin film transistor 21 from the on state to the off state (S7), and the capacitor 23 maintains the voltage value (Vg2) only for a predetermined period t4 (S8).

After the voltage value (ΔV2) is maintained only for the predetermined period t4, the controller 15 applies a determined voltage to the data line 11 in order to apply the determined voltage to the gate electrode of the target vertical organic light emitting transistor 20 based on the next image data to be displayed (S9). Thereafter, the above operation from step S2 to step S9 is repeated until the power supply is stopped or control is stopped.

In this embodiment, as shown in FIG. 7, t2>t4 is set for each time, and control is performed so that ΔV1=?ΔV2. However, the length of each time and the relationship of the voltage value can be arbitrarily determined.

In the above configuration, when the driving a light emitting method is performed, charge accumulated at, for example, an interface between the source electrode layer 20s of the vertical organic light emitting transistor 20, and the gate insulating film layer 20h and the organic semiconductor layer 20a is released, and the characteristics of the vertical organic light emitting transistor 20 can be recovered to approach the state where the transistor has just been manufactured or at the time of factory shipment. Therefore, the display 1 is suppressed from changing in brightness over a long period of time.

In the driving a light emitting method of this embodiment, as described above, in the state at t4, the vertical organic light emitting transistor 20 is in the off state, and almost no current flows. Therefore, a black screen is inserted at frame rate intervals.

When in the driving a light emitting method of this embodiment, as described above, in the state at t4, the vertical organic light emitting transistor 20 is in the off state, the Vdd voltage on the current supply line can maintain the same value as in the state at t2. However, the Vdd voltage on the current supply line can also be changed to a different value during the t4 period, such as to an opposite voltage of appropriate value. In this case, the voltage between the source electrode and the cathode electrode of the vertical light emitting transistor will follow the voltage change on the current supply line to become opposite as well. This will affect all pixels sharing the current supply line, therefore this is done only when all pixels sharing the current supply line are at the t4 period. Opposite voltage between the source electrode and cathode electrode of the vertical light emitting transistor can induce electric field distribution across the whole stack of the vertical light emitting transistor layers that is opposite to the electric field during light emitting period, potentially de-trap accumulated or trapped charges within and between each functional and auxiliary layers including the organic semiconductor channel layer, hole injection layer, hole transport layer, organic EL layer, electron transport layer, and electron injection layer. The de-trapping of charges from these layers and/or interfaces can help reduce the operation voltage of the vertical light emitting transistor and increase its lifetime. Because this voltage reversal on the current supply line is done during black screen insertion period, panel brightness or display content won't be affected.

In a liquid crystal display or an organic EL display, a screen different from an image displayed at frame rate intervals is inserted for a moment, so that afterimages are reduced when a previous image is switched to the next image. Thus, the display 1 can display images and moving images more clearly by suppressing afterimages by the above method.

Another Embodiment

Hereinafter, another embodiment will be described.

<1> In the above-described driving a light emitting method, as Vg2 applied to the gate electrode of the vertical organic light emitting transistor 20, a predetermined voltage value may be applied regardless of Vg1.

<2> In the above driving a light emitting method, the application of Vg2 to the gate electrode of the vertical organic light emitting transistor 20 does not necessarily have to be performed every time an image to be displayed is updated, and Vg2 may be applied every time image update is performed several times.

<3> The display 1 may be configured to emit light, emitted from the organic EL layer 20c, to the opposite side of the substrate 30 and display an image. This configuration is also called a "top emission method", and has an advantage that an element can be configured between the vertical organic light emitting transistor 20 and the substrate 30.

<4> The configuration and control method included in the display 1 described above are merely examples, and the present invention is not limited to the illustrated configurations.

The invention claimed is:

1. A method of driving a light emitting display comprising:

a step (A) of applying a voltage based on image data to be displayed to a gate electrode of a vertical organic light emitting transistor including source, drain, and gate electrodes arranged in one direction; and a step (B) of, after the step (A), applying a voltage, having a polarity opposite to that of the voltage applied to the gate electrode of the vertical organic light emitting transistor in the step (A), to the gate electrode of the vertical organic light emitting transistor based on a value of a voltage being applied to a source electrode of the vertical organic light emitting transistor.

2. The method of driving a light emitting display according to claim 1, wherein the step (A) and the step (B) are performed for each frame rate.

3. The method of driving a light emitting display according to claim 2, wherein control is performed such that the larger a difference between the voltage applied to the source electrode of the vertical organic light emitting transistor and the voltage applied to the gate electrode of the vertical organic light emitting transistor in the step (A), the larger a difference between the voltage applied to the source electrode of the vertical organic light emitting transistor and the voltage applied to the gate electrode of the vertical organic light emitting transistor in the step (B).

4. The method of driving a light emitting display according to claim 2, wherein control is performed such that the difference between the voltage applied to the source electrode of the vertical organic light emitting transistor and the voltage applied to the gate electrode of the vertical organic light emitting transistor in the step (B) is equal to the difference between the voltage applied to the source electrode of the vertical organic light emitting transistor and the voltage applied to the gate electrode of the vertical organic light emitting transistor in the step (A).

5. The method of driving a light emitting display according to claim 2, wherein a time for applying a voltage to the gate electrode of the vertical organic light emitting transistor in the step (B) is shorter than a time for applying a voltage to the gate electrode of the vertical organic light emitting transistor in the step (A).

6. The method of driving a light emitting display according to claim 2, wherein in a duration of the time in the step (B), for all pixels sharing a same current supply line, apply a voltage to the current supply line with an opposite polarity than that of a voltage applied to the current supply line during step (A).

7. A display comprising:
a plurality of vertical organic light emitting transistors including source, drain, and gate electrodes arranged in one direction; and
a controller for controlling driving of a vertical organic light emitting transistor, wherein the controller is configured to display an image by:
(A) applying a voltage based on image data to be displayed to a gate electrode of the vertical organic light emitting transistor of the plurality of vertical organic light emitting transistors; and
(B) applying a voltage, having a polarity opposite to that of the voltage applied to the gate electrode of the vertical organic light emitting transistor in (A), to the gate electrode of the vertical organic light emitting transistor based on a value of a voltage being applied to a source electrode of the vertical organic light emitting transistor.

8. The method of driving a light emitting display according to claim 3, wherein a time for applying the voltage to the gate electrode of the vertical organic light emitting transistor in the step (B) is shorter than a time for applying the voltage to the gate electrode of the vertical organic light emitting transistor in the step (A).

9. The method of driving a light emitting display according to claim 4, wherein a time for applying the voltage to the gate electrode of the vertical organic light emitting transistor in the step (B) is shorter than a time for applying the voltage to the gate electrode of the vertical organic light emitting transistor in the step (A).

10. The method of driving a light emitting display according to claim 3, wherein in a duration of the time in the step (B), for all pixels sharing a same current supply line, apply a voltage to the current supply line with an opposite polarity than that of a voltage applied to the current supply line during step (A).

11. The method of driving a light emitting display according to claim 4, wherein in a duration of the time in the step (B), for all pixels sharing a same current supply line, apply a voltage to the current supply line with an opposite polarity than that of a voltage applied to the current supply line during step (A).

12. The method of driving a light emitting display according to claim 5, wherein in a duration of the time in the step (B), for all pixels sharing a same current supply line, apply a voltage to the current supply line with an opposite polarity than that of a voltage applied to the current supply line during step (A).

13. The method of driving a light emitting display according to claim 8, wherein in a duration of the time in the step (B), for all pixels sharing a same current supply line, apply a voltage to the current supply line with an opposite polarity than that of a voltage applied to the current supply line during step (A).

14. The method of driving a light emitting display according to claim 9, wherein in a duration of the time in the step (B), for all pixels sharing a same current supply line, apply a voltage to the current supply line with an opposite polarity than that of a voltage applied to the current supply line during step (A).

15. The display according to claim 7, wherein (A) and (B) are performed for each frame rate.

16. The display according to claim 15, wherein control is performed such that the larger a difference between the voltage applied to the source electrode of the vertical organic light emitting transistor and the voltage applied to the gate electrode of the vertical organic light emitting transistor in (A), the larger a difference between the voltage applied to the source electrode of the vertical organic light emitting transistor and the voltage applied to the gate electrode of the vertical organic light emitting transistor in (B).

17. The display according to claim 15, wherein control is performed such that the difference between the voltage applied to the source electrode of the vertical organic light emitting transistor and the voltage applied to the gate electrode of the vertical organic light emitting transistor in (B) is equal to the difference between the voltage applied to the source electrode of the vertical organic light emitting transistor and the voltage applied to the gate electrode of the vertical organic light emitting transistor in (A).

18. The display according to claim 15, wherein a time for applying the voltage to the gate electrode of the vertical organic light emitting transistor in (B) is shorter than a time for applying the voltage to the gate electrode of the vertical organic light emitting transistor in (A).

19. The display according to claim 15, wherein in a duration of the time in the step (B), for all pixels sharing the same current supply line, apply a voltage to a current supply line with an opposite polarity than that of a voltage applied to the current supply line during step (A).

* * * * *